United States Patent
Adkisson et al.

(10) Patent No.: US 9,300,272 B2
(45) Date of Patent: Mar. 29, 2016

(54) TUNABLE FILTER STRUCTURES AND DESIGN STRUCTURES

(71) Applicant: INTERNATIONAL BUSINESS MACHINES CORPORATION, Armonk, NY (US)

(72) Inventors: James W. Adkisson, Jericho, VT (US); Panglijen Candra, Essex Junction, VT (US); Thomas J. Dunbar, Burlington, VT (US); Mark D. Jaffe, Shelburne, VT (US); Robert K. Leidy, Burlington, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/700,744

(22) Filed: Apr. 30, 2015

(65) Prior Publication Data

US 2015/0244345 A1  Aug. 27, 2015

Related U.S. Application Data

(63) Continuation of application No. 13/292,729, filed on Nov. 9, 2011, now Pat. No. 9,054,671.

(51) Int. Cl.
*H03H 9/00* (2006.01)
*H03H 9/54* (2006.01)
(Continued)

(52) U.S. Cl.
CPC ............ *H03H 9/545* (2013.01); *H03H 9/0547* (2013.01); *H03H 9/171* (2013.01); *H03H 9/173* (2013.01); *H03H 9/56* (2013.01); *H03H 2009/02204* (2013.01); *Y10T 29/42* (2015.01)

(58) Field of Classification Search
CPC ................. H03H 9/02007; H03H 2009/02173
USPC .................... 333/186, 187, 197; 310/312, 321
See application file for complete search history.

(56) References Cited

U.S. PATENT DOCUMENTS 5,587,620 A   12/1996 Ruby et al.
6,204,737 B1   3/2001 Ella
(Continued)

FOREIGN PATENT DOCUMENTS

EP    1959568 A1   8/2008

OTHER PUBLICATIONS

Pranonsatit et al. "RF-MEMS Activities in Europe", Invited Paper: Microwave Workshops and Exhibition (MWE 2005) Digest, Nov. 2005, pp. 111-122, Japan.
(Continued)

*Primary Examiner* — Dean Takaoka
(74) *Attorney, Agent, or Firm* — Anthony Canale; Andrew M. Calderon; Roberts Mlotkowski Safran & Cole, P.C.

(57) ABSTRACT

Tunable filter structures, methods of manufacture and design structures are disclosed. The method of forming a filter structure includes forming a piezoelectric resonance filter over a cavity structure. The forming of the piezoelectric resonance filter includes: forming an upper electrode on one side of a piezoelectric material; and forming a lower electrode on an opposing side of the piezoelectric material. The method further includes forming a micro-electro-mechanical structure (MEMS) cantilever beam at a location in which, upon actuation, makes contact with the piezoelectric resonance filter.

6 Claims, 6 Drawing Sheets

(51) Int. Cl.
*H03H 9/17* (2006.01)
*H03H 9/56* (2006.01)
*H03H 9/05* (2006.01)
*H03H 9/15* (2006.01)
*H03H 9/02* (2006.01)

(56) References Cited

U.S. PATENT DOCUMENTS

| | | | |
|---|---|---|---|
| 6,307,447 | B1 | 10/2001 | Barber et al. |
| 6,462,460 | B1 | 10/2002 | Tikka et al. |
| 6,874,211 | B2 | 4/2005 | Bradley et al. |
| 6,924,583 | B2 | 8/2005 | Lin et al. |
| 7,030,718 | B1 | 4/2006 | Scherer |
| 7,592,739 | B2 | 9/2009 | Robert |
| 7,675,388 | B2 | 3/2010 | Cardona et al. |
| 7,701,312 | B2 | 4/2010 | Park et al. |
| 9,054,671 | B2 * | 6/2015 | Adkisson et al. |
| 2005/0179508 | A1 * | 8/2005 | Sato ............... 333/187 |
| 2010/0060386 | A1 | 3/2010 | Belot et al. |
| 2010/0127596 | A1 * | 5/2010 | Ayazi et al. ............... 310/300 |
| 2013/0169383 | A1 | 7/2013 | Adkisson et al. |
| 2013/0214877 | A1 | 8/2013 | Adkisson et al. |

OTHER PUBLICATIONS

Lakdawala et al. "Simple Post-Processing Technique to Tune Resonant Frequency of Film Bulk Acoustic Resonators and Stacked Crystal Filters", 1998 IEEE International Frequency Control Symposium, pp. 831-835.

H. Campanella Pineda "Thin-Film Bulk Acoustic Wave Resonators—FBAR", pp. 1-234, Dec. 2007, Ph.D Thesis Universite de Montpellier II (UM2) and Universitat Autonoma de Barcelona (UAB).

* cited by examiner

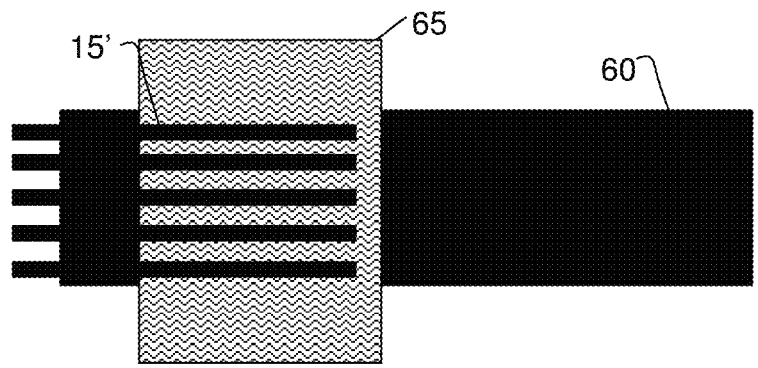
FIG. 4a
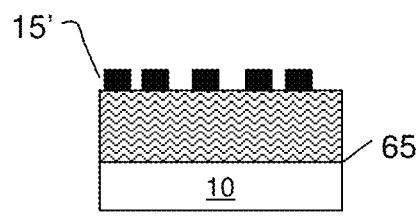
FIG. 4b
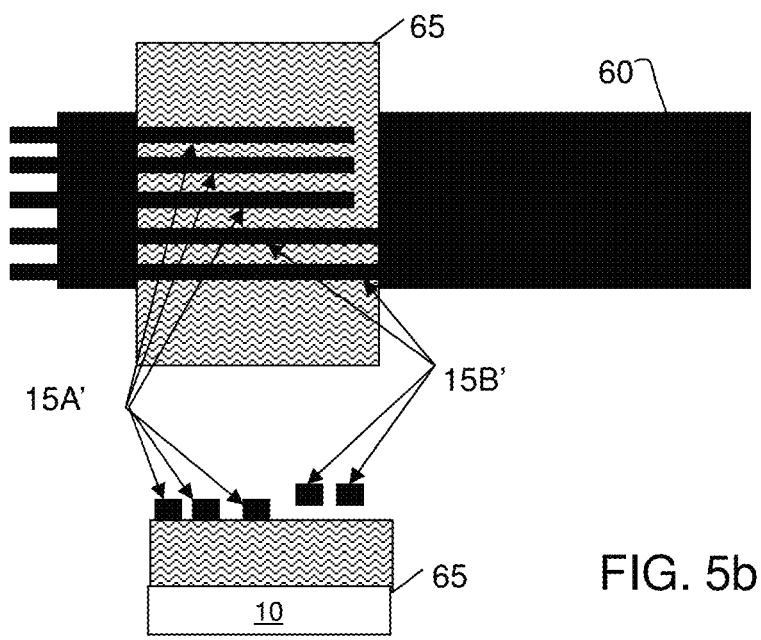
FIG. 5a
FIG. 5b

TUNABLE FILTER STRUCTURES AND DESIGN STRUCTURES

FIELD OF THE INVENTION

The invention relates to semiconductor structures and methods of manufacture and, more particularly, to tunable filter structures, methods of manufacture and design structures.

BACKGROUND

A Thin Film Bulk Acoustic Resonator (FBAR or TFBAR) is a device consisting of a piezoelectric material sandwiched between two electrodes and acoustically isolated from the surrounding medium. FBAR devices using piezoelectric films can be used as radio frequency (RF) filters for use in cell phones and other wireless applications. FBARs can also be used in a variety of other applications such as microwave oscillators and sensor applications.

FBARs utilize the acoustic resonant characteristics of piezoelectric materials, such as AlN or ZnO, to remove unwanted frequencies from being transmitted in a device, while allowing other specific frequencies to be received and transmitted. The resonant frequency is inversely proportional to the thickness of the piezoelectric film. Accordingly, to adjust the acoustic resonant characteristics of the FBAR, thickness of the piezoelectric film can be adjusted. Alternatively or in addition, the FBAR can be put under a mechanical load so that its resonance frequency can shift. This is known as a mass loading effect.

The mass loading effect can be accomplished by depositing or growing a mass of film on the resonator to bring about downshifting of the resonance frequency of the FBAR. The mass loading is carried out by growing or depositing of a thin film material uniformly distributed on one electrode of the resonator, covering the active surface of the device. The thin film can be a dielectric material or a metal material, depending on the design criteria.

However, it is known that processing flows may affect the acoustic resonant characteristics of the FBAR. For example, more or less piezoelectric material can be deposited for devices in different runs, due to processing variations. Similarly, more or less mass loading material can be deposited for devices in different runs, due to processing variations. Moreover, once the FBAR is built, it is difficult, if not impossible, to tune the resonant frequency.

Accordingly, there exists a need in the art to overcome the deficiencies and limitations described hereinabove.

SUMMARY

In a first aspect of the invention, a method of forming a filter structure comprises forming a piezoelectric resonance filter over a cavity structure. The forming of the piezoelectric resonance filter comprises: forming an upper electrode on one side of a piezoelectric material; and forming a lower electrode on an opposing side of the piezoelectric material. The method further comprises forming a micro-electro-mechanical structure (MEMS) cantilever beam at a location in which, upon actuation, makes contact with the piezoelectric resonance filter.

In another aspect of the invention, a filter structure comprises a piezoelectric resonance filter formed over a cavity structure, wherein the piezoelectric resonance filter comprises: an upper electrode on one side of a piezoelectric material; and a lower electrode on opposing side of the piezoelectric material. The structure further comprises a micro-electro-mechanical structure (MEMS) cantilever beam fixed on one side in an insulator material and suspended over the piezoelectric resonance filter at a location in which, upon actuation, makes contact with the piezoelectric resonance filter.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the tunable filter structures, which comprises the structures of the present invention. In still further embodiments, a method in a computer-aided design system is provided for generating a functional design model of the tunable filter structures. The method comprises generating a functional representation of the structural elements of the tunable filter structures.

More specifically, in embodiments, a method is provided in a computer-aided design system for generating a functional design model of a tunable filter structure. The method comprises generating a functional representation of a piezoelectric resonance filter formed over a cavity structure, wherein the piezoelectric resonance filter comprises: an upper electrode on one side of a piezoelectric material; and a lower electrode on opposing side of the piezoelectric material. The method further comprises generating a functional representation of a micro-electro-mechanical structure (MEMS) cantilever beam at a location in which, upon actuation, makes contact with the piezoelectric resonance filter.

In an additional aspect of the invention, a method comprises determining a first resonant frequency of a filter; and loading the filter to change the first resonant frequency to a second resonant frequency different than the first resonant frequency.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

FIG. 4a shows a top view of the structure of FIG. 3a, with the MEMS in an actuated position in accordance with aspects of the present invention;

FIG. 4b shows a side view of FIG. 4a, in accordance with aspects of the present invention;

FIG. 5a shows a top view of the structure of FIG. 3a, with a plurality of MEMS in an actuated position in accordance with aspects of the present invention;

FIG. 5b shows a side view of FIG. 5a, in accordance with aspects of the present invention;

DETAILED DESCRIPTION

The invention relates to semiconductor structures and methods of manufacture and, more particularly, to tunable filter structures, methods of manufacture and design structures. In embodiments, the tunable filter structures of the present invention are Thin Film Bulk Acoustic Resonators (FBAR) capable of being tuned, in situ, and/or post processing and/or post packaging, using a variety of different loading structures. It should be understood that the present invention is not limited to an FBAR structure, and that other types of filters are also contemplated by the present invention. In embodiments, the loading structures include micro-electro-mechanical structures (MEMS), which can be actuated to load the FBAR at particular locations and loads in order to adjust the resonant frequency of the FBAR.

More specifically, the FBAR (or other type of filter) of the present invention comprises a piezoelectric material sandwiched between two electrodes and acoustically isolated from the surrounding medium. In embodiments, the FBAR can include any common piezoelectric materials such as, for example, aluminum nitride or zinc oxide. Advantageously, the FBAR of the present invention is dynamically tunable (i.e., in situ, and/or post processing and/or post packaging) using a MEMS positioned in proximity to the FBAR. The MEMS can be used in combination with a loading mass (e.g., loading bar), for example, to apply a mechanical load on the FBAR, thus shifting its resonant frequency. In embodiments, the MEMS can be a cantilever beam or an array of beams capable of modifying the load applied on the FBAR (or other filter type), thus allowing dynamic resonant frequency tuning. The loading methodology of the MEMS can be expanded to a variety of voltages, heights, cantilever geometries, layouts, stiction points, etc. in order to tune the resonance frequency of the FBAR or other types of filters.

Figure 1:
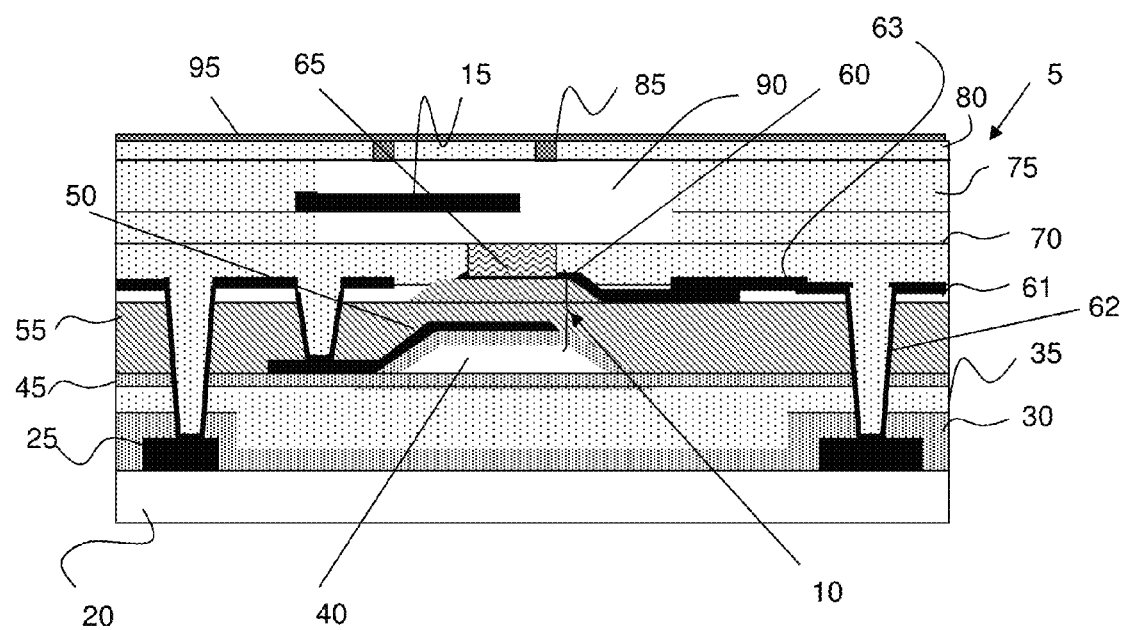
FIG. 1 shows a tunable filter structure and respective fabrication processes in accordance with aspects of the present invention.

FIG. 1 shows a tunable filter structure and respective fabrication processes in accordance with aspects of the present invention. More specifically, FIG. 1 shows a structure 5 of the present invention, which includes an FBAR (or other filter) 10 and a MEMS 15. Depending on the particular application and design criteria, the MEMS 15 can come in many different forms. For example, the MEMS 15 can be realized in the form of a cantilever beam structure or a beam structure. In the cantilever structure, a cantilever arm (suspended electrode with one end fixed) is pulled toward a fixed electrode by application of an actuation voltage, to make contact with and apply a load to the FBAR 10. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness, any of which can be adjusted for the present invention.

Alternatively, the MEMS 15 could be a bridge structure, where both ends are fixed. In this alternative, the central portion of the MEMS beam 15 will be pulled down to make contact with and apply a load to the FBAR 10.

The MEMS 15 can be manufactured in a number of ways using a number of different tools. In general, though, the methodologies and tools are used to form small structures with dimensions in the micrometer scale with dimensions of approximately 5 µm thick, 100 µm wide, and 400 µm long; although other dimensions are also contemplated by the present invention. Many of the methodologies, i.e., technologies, employed to manufacture MEMS are adopted from integrated circuit (IC) technology. For example, the MEMS 15 can be realized in thin films of materials patterned by photolithographic processes and fixed at one end to an insulator material, and suspended within a cavity. In particular, the fabrication of the MEMS 15 can implement: (i) deposition of thin films of material on a substrate (e.g., insulator layer), (ii) apply a patterned mask on top of the films by photolithographic imaging, and (iii) etch the films selectively to the mask.

Referring more specifically to the structure 5 shown in FIG. 1, a substrate 20 is provided which, in embodiments, can be any layer of a device such as wires, transistors, passive elements, memory elements, etc. For example, in embodiments, the substrate 20 can be a silicon wafer coated with silicon dioxide or other insulator material known to those of skill in the art. The substrate 20 can also be an oxide or oxide based material. A wiring layer 25 is formed on the substrate 20 using any known deposition and patterning processes. For example, conductive material can be deposited on the substrate 20 using, for example, conventional chemical vapor deposition (CVD) processes. The conductive material can be patterned using conventional reactive ion etching (RIE) processes, to form the wiring layer 25.

In one non-limiting example, the wiring layer 25 can be deposited on the substrate 20 to a depth of about 0.05 to 4 µm and preferably to a depth of 0.25 µm; although other dimensions are also contemplated by the present invention. In embodiments, the wiring layer 25 can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, the wiring layer 25 could be formed from pure refractory metals, or aluminum or an aluminum alloy such as AlCu, AlSi, or AlCuSi. In embodiments, the wiring layer 25 can be in electrical contact with an interconnect such as, for example, a tungsten or copper stud provided in a conventionally formed via.

Still referring to FIG. 1, a passivation layer 30 is deposited over the wiring layer 25 and exposed portions of the substrate 20. The passivation layer 30 can be any conventional insulator layer, e.g., oxide, deposited using any conventional conformal deposition processes, e.g., CVD. In embodiments, the passivation layer 30 is an oxide material, such as $SiO_2$, deposited at temperatures compatible with aluminum wiring, e.g., under about 420° C. and preferably under about 400° C. Deposition options for the passivation layer 30 include, for example, one or more of plasma-enhanced CVD (PECVD), sub-atmospheric CVD (SACVD), atmospheric pressure CVD (APCVD), high density plasma CVD (HDPCVD), physical vapor deposition (PVD), or atomic layer deposition (ALD). In embodiments, the passivation layer 30 is deposited to a depth of about 80 nm; although other dimensions are also contemplated by the present invention.

An insulator layer 35 is deposited on the passivation layer 30. In embodiments, the insulator layer 35 can be, for example, $SiO_2$. The insulator layer 35 can be deposited using any conventional CVD processes, as noted above. In embodiments, the insulator layer 35 can undergo a planarization process, such as chemical mechanical polishing (CMP). A sacrificial material (not shown) is deposited on the insulator layer 35 to a depth of a few micrometers or less, and then patterned in a shape of cavity (e.g., air gap) 40. The sacrificial material can be, for example, PMGI or other known sacrificial material.

A dielectric layer 45 is formed on the sacrificial material. The dielectric layer 45 can be any known dielectric material, e.g., oxide based material, deposited using any conventional deposition process, e.g., CVD, to a depth of about 80 nm; although other dimensions are also contemplated by the present invention. After deposition of the dielectric layer 45, the cavity (e.g., air gap) 40 can be formed using any known venting process, i.e., patterning a hole in the dielectric layer 45, and etching the sacrificial material using a dry or wet etching solution, depending on the type of sacrificial material. The cavity (e.g., air gap) 40 can also be formed in subsequent processing steps, depending on the processing flow. For example, the cavity (e.g., air gap) 40 can be formed after the formation of the FBAR 10.

Still referring to FIG. 1, the FBAR 10 comprises a lower electrode or wiring layer 50, a piezoelectric film 55 and an upper electrode or wiring layer 60, in addition to an optional loading bar 65. More specifically, the lower electrode or wiring layer 50 is formed by depositing and patterning a metal or metal alloy on the dielectric layer 45. In embodiments, the lower electrode or wiring layer 50 can be any conductive material, deposited using any conventional deposition processes to a thickness of about 0.05 to 4 μm and preferably to a depth of 0.25 μm; although other dimensions are also contemplated by the present invention. The materials and processes steps for forming the lower electrode or wiring layer 50 can be similar to that described with reference to the wiring layer 25.

The piezoelectric film 55 is deposited on the lower electrode or wiring layer 50 and any exposed portions of the dielectric layer 45. In embodiments, the thickness of the piezoelectric material 55 can vary depending on the desired resonant frequency, $\lambda/4$. For example, in a non-limiting illustrative embodiment, the piezoelectric film 55 can have a thickness ranging from several micrometers to tenth of micrometers, and can resonant in the frequency range of roughly 100 MHz to 10 GHz; although other dimensions and frequencies are also contemplated by the present invention. In embodiments, the piezoelectric film 55 can include any common piezoelectric materials such as, for example, aluminum nitride and/or zinc oxide.

The upper electrode or wiring layer 60 is deposited and patterned on the piezoelectric film 55. In embodiments, the upper electrode or wiring layer 60 can be any conductive material, deposited using any conventional deposition processes to a thickness of about 0.05 to 4 μm and preferably to a depth of 0.25 μm; although other dimensions are also contemplated by the present invention. The materials and deposition processes for forming the upper electrode or wiring layer 60 can be similar to that described with reference to the wiring layer 25.

The loading bar 65 is deposited and patterned on the upper electrode or wiring layer 60, using any conventional deposition and patterning processes. In embodiments, the loading bar 65 can be any material which provides a mechanical load to the FBAR 10, i.e., tunes the resonant frequency of the FBAR 10. For example, the loading bar 65 can be a metal, polysilicon or dielectric material. In embodiments, the loading bar 65 can be a doped poly or a metal layer, which acts as a fixed actuator electrode for pulling down the MEMS 15. Alternatively, the upper electrode or wiring layer 60 can act as the fixed actuator electrode for pulling down the MEMS 15. In this alternative approach, the loading bar 65 can be a thin dielectric material.

The MEMS 15 can be formed using many different processes, none of which are limiting to the present invention. For example, the MEMS 15 can be formed from a single layer or several layers of materials, suspended on one end by insulator layer (insulator layer 70 and/or 75), for example, and suspended within a cavity over the FBAR 10. By way of illustration, the MEMS 15 can be a conductive metal or metal alloy, or an insulator layer (e.g., oxide) coated with a conductive metal or metal alloy below and/or above the insulator layer, formed using conventional deposition and patterning processes. In any of the embodiments, the MEMS 15 is formed by conventional CMOS processes, e.g., deposition and patterning processes, as discussed herein. The MEMS 15 can vary in shape, thickness and other dimensions, depending on the desired mass loading effect. Embodiments of the MEMS 15 are described with reference to FIGS. 2a, 2b, 3a, 3b, 4a, 4b, 5a, 5b, 6a, 6b and 7, and of which can be combined together to form distinct structures.

In embodiments, interconnect structures 62 can be formed in the structure, extending to the wiring layer 25 and lower electrode or wiring layer 50. In embodiments, the interconnect structures 62 are metal wiring, which can be formed using the same materials as the upper electrode or wiring layer 60. For example, in order to form interconnect structures 62 in contact with the wiring layer 50, a via is etched through layers 55, 45, 35 and 30 to expose the wiring layer 50. Conductive material (e.g., metal or metal alloy) is then deposited in the manner described with regard to the upper electrode or wiring layer 50. Similarly, in order to form interconnect structures 62 in contact with the lower electrode or wiring layer 50, after forming a via through layer 55, metal or metal alloy can be deposited in the manner described with regard to the upper electrode or wiring layer 50. The interconnect structures 62 can be, for example, any known interconnect material such as Ti, TiN, TaN, etc. In embodiments, the interconnect structures 62 can be formed on a dielectric layer 61, formed on the piezoelectric film 55. A conductive wiring layer 63 can also be formed in electrical contact with the upper electrode or wiring layer 60.

In embodiments, after the formation of the loading bar 65, an insulator layer 70, e.g., oxide, is deposited using conventional deposition methods. The insulator layer 70 can be patterned to form a trench, which is then filled with a sacrificial material, e.g., PMGI. A beam (e.g., MEMS 15) is formed on the insulator layer 70, and over the sacrificial material. As noted above, the beam (e.g., MEMS 15) can be formed from depositing and patterning a single layer or several layers in a variety of dimensions, e.g., shapes, sizes, thicknesses, etc. An insulator layer 75, e.g., oxide, is deposited over the MEMS 15, using conventional deposition methods. The insulator layer 75 is patterned to form a trench, which is then filled with a sacrificial material, e.g., PMGI. An insulator layer 80, e.g., oxide, is then deposited on the insulator layer 75.

In embodiments, a vent hole 85 is patterned and opened in the insulator layer 80, exposing a portion of the sacrificial material. It should be understood that more than one vent hole 85 can be formed in the insulator layer 80. The vent hole 85 can be formed using conventional lithographic and etching processes known to those of skill in the art. The width and height of the vent hole 85 determines the amount of material that should be deposited after venting to pinch off the vent hole 85. The vent hole 85 may be circular or nearly circular to minimize the amount of subsequent material needed to pinch it off.

In FIG. 1, the sacrificial material is vented or stripped by way of the vent hole 85. In embodiments, the stripping (e.g., etching) can be performed using an etchant that is selective to removing of the sacrificial material through the vent hole 85. The etching will strip all of the sacrificial material forming an upper cavity or chamber and a lower cavity or chamber 90. The vent hole 85 can be sealed with a material 95, such as a dielectric or metal. To avoid an issue of sealing material entering the cavity and depositing on the MEMS 15, in embodiments, the vent holes 85 should be strategically placed away from the MEMS 15, so that no vent hole sealing material is deposited on the released MEMS beam.

Figure 2A:
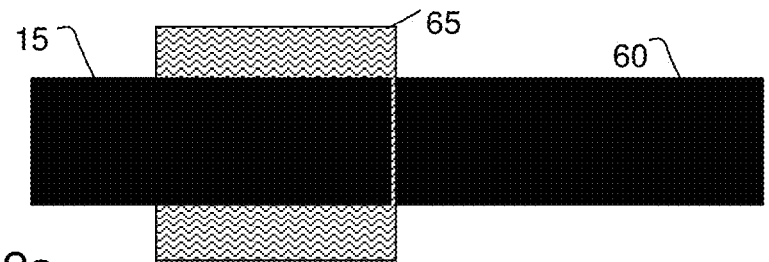
FIG. 2a shows a top view of the tunable filter in accordance with aspects of the present invention.
Figure 2B:
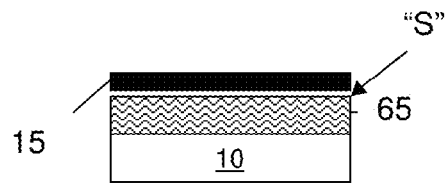
FIG. 2b shows a side view of FIG. 2a, in accordance with aspects of the present invention.

FIG. 2a shows a top view of the tunable filter in accordance with aspects of the present invention. As shown in FIG. 2a, the MEMS 15 is a monolithic, cantilever beam structure (e.g., single cantilever beam structure) which extends over a length of the loading bar 65. As shown in this view, the MEMS 15 is rectangular in shape; although other shapes are also contemplated by the present invention. As in any of the embodiments, it should be understood by those of skill in the art that the MEMS 15 can be implemented without the loading bar 65. FIG. 2b shows a side view of FIG. 2a, in which a space "S" is provided between the MEMS 15 and the loading bar 65. The space "S" can range from 0.1 to 5 µm depending on the design criteria. It should be understood that adjustment to the space, as well as the pull down voltage of the MEMS 15, can be used to adjust the mass loading effect on the FBAR 10.

FIGS. 2a and 2b show the MEMS 15 in a non-actuated state (i.e., space between the MEMS 15 and FBAR (e.g., loading bar)). In this non-actuated state, the MEMS 15 does not place any mechanical load on the FBAR and hence will not shift the resonant frequency of the FBAR. However, upon an application of voltage, the MEMS 15 would be pulled into contact with the FBAR, i.e., loading bar 65, providing a mechanical load on the FBAR and hence shifting its resonant frequency. The application of voltage can be provided by, for example, the loading bar 65 or the upper electrode or wiring layer 60. As should be understood by those of skill in the art, the loading effect can be adjusted using many different variables such as, for example:

(i) dimensions (e.g., shape, size, etc.) of the MEMS;
(ii) density or other material properties of the MEMS;
(iii) stiction point of MEMS to the FBAR;
(iv) pull down voltage applied to the MEMS; and/or
(v) spacing between the MEMS and FBAR, etc.

Figure 3A:
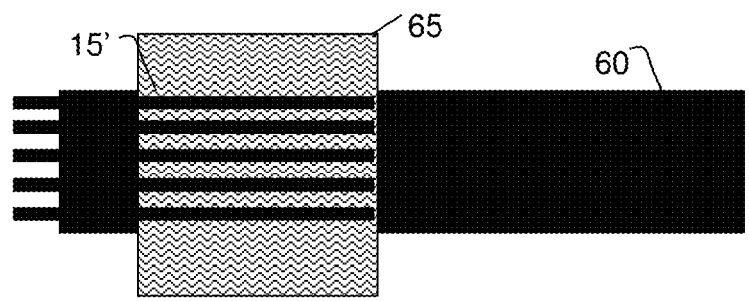
FIG. 3a shows a top view of an alternate structure of the tunable filter in accordance with aspects of the present invention.
Figure 3B:
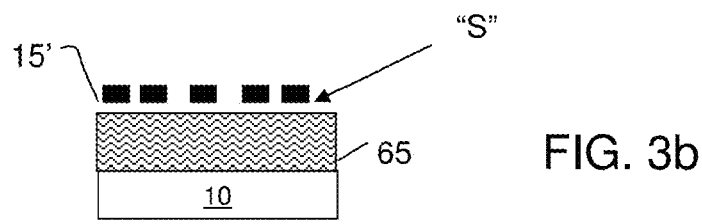
FIG. 3b shows a side view of FIG. 3a, in accordance with aspects of the present invention.

FIG. 3a shows a top view of an alternate structure of the tunable filter in accordance with aspects of the present invention. As shown in FIG. 3a, the MEMS 15' comprises a plurality of cantilever strips or fingers (e.g., comb structure) which extend over a length of the loading bar 65. As in each embodiment using a comb structure, the cantilever strips or fingers can overlap or be different lengths. FIG. 3b shows a side view of FIG. 3a, in which a space "S" is shown between each of the MEMS 15' as well as between the MEMS 15' and the loading bar 65. The space "S" can range from about 0.1 µm to 5 µm.

FIG. 4a shows a top view of the structure of FIG. 3a, with all of the MEMS fingers 15' in an actuated position, i.e., in mechanical contact with the FBAR. FIG. 4b shows a side view of FIG. 4a. As shown in both FIGS. 4a and 4b, each of the cantilever strips or fingers of the MEMS 15' are pulled down into contact with the loading bar 65. This provides a mechanical load to the FBAR which, in turns, shifts the resonant frequency of the FBAR.

FIG. 5a shows a top view of the structure of FIG. 3a, with select cantilever strips or fingers of the MEMS in an actuated position and remaining cantilever strips or fingers in an non-actuated state. FIG. 5b shows a side view of FIG. 5a. More specifically, FIGS. 5a and 5b show MEMS cantilever strips or fingers 15A' in contact with the FBAR (e.g., loading bar 65); whereas, MEMS cantilever strips or fingers 15B' are not in contact with the FBAR (e.g., loading bar 65). In this configuration, the mechanical loading effect on the FBAR is shown to be adjustable by pulling down a select amount of the MEMS cantilever strips or fingers.

Figure 6A:
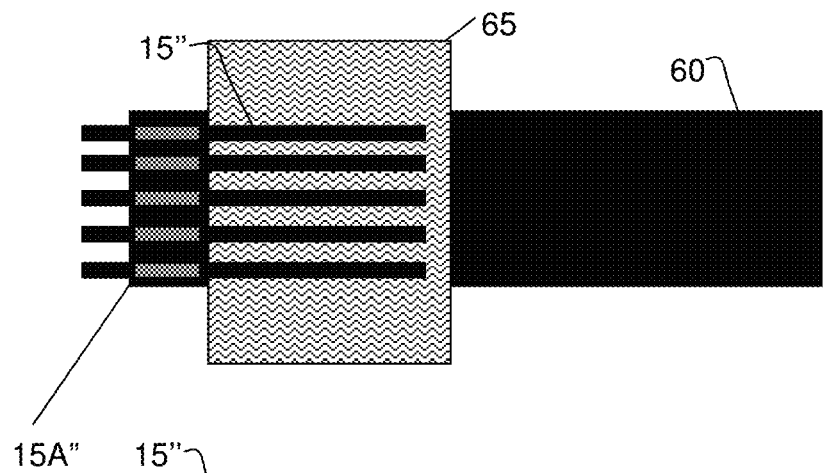
FIG. 6a shows a top view of an alternate structure of the tunable filter in accordance with aspects of the present invention.

FIG. 6a shows a top view of an alternate structure of the tunable filter in accordance with aspects of the present invention. More specifically, FIG. 6a shows a plurality of MEMS cantilever strips or fingers 15", each with a high resistive area 15A". The high resistive area 15A" can be a thin high resistive metal or photoconductive material such as undoped polysilicon. As an alternative, the high resistive area 15A" can be representative of a different cross sectional dimension of the MEMS cantilever strips or fingers 15", which can rupture. In any of these alternatives, the material selection may be based on preventing a catastrophic explosion that may harm nearby elements.

In operation, a voltage of about 35V to about 50V can be applied to the thin high resistive area 15A", causing electromigration and resulting in a physical separation in the MEMS cantilever strips or fingers 15". The voltage, of course, can vary depending on the geometry and material selections. This breakage, in turn, results in a stiction phenomenon (e.g., locking) of the MEMS cantilever strips or fingers 15" to the FBAR (e.g., loading bar 65). Thus, similar to blowing a fuse, upon the application of a current, one or more of the MEMS cantilever strips or fingers 15" can break or crack, resulting in a mechanical load on the FBAR.

Figure 6B:
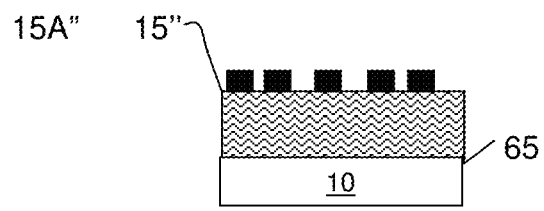
FIG. 6b shows a side view of FIG. 6a, in accordance with aspects of the present invention.

FIG. 6b shows a side view of FIG. 6a, in which each of the MEMS cantilever strips or fingers 15" have been broken, and thus provide a mechanical load to the FBAR. However, it should be understood by those of skill in the art that any number of the MEMS cantilever strips or fingers 15" can be broken, by selectively applying a current to such select number of MEMS cantilever strips or fingers 15".

Figure 7:
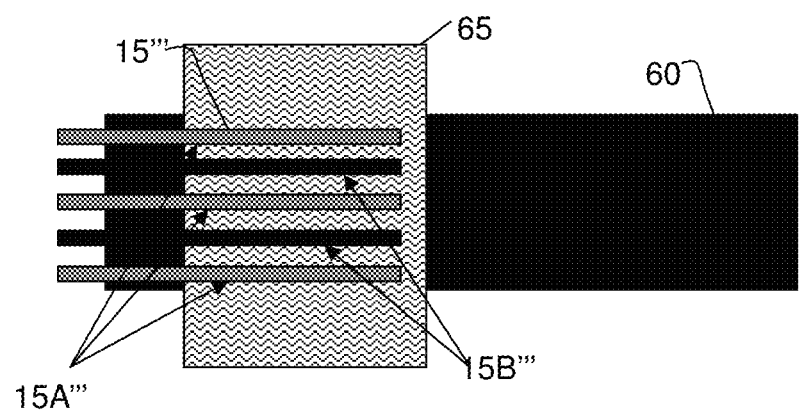
FIG. 7 shows a top view of an alternate structure of the tunable filter in accordance with aspects of the present invention.

FIG. 7 shows a top view of an alternate structure of the tunable filter in accordance with aspects of the present invention. In this embodiment, the MEMS cantilever strips or fingers 15''' can be made from different materials (different material properties such as density, etc.), thus providing different mechanical loads at different locations on the FBAR. For example, the MEMS cantilever strips or fingers comprise one or more MEMS cantilever strips or fingers 15A''' comprising the same material as the loading bar 65; whereas, the MEMS cantilever strips or fingers 15B''' comprise different material such as, for example, $Si_xN_y$, or any of the plurality of different combinations of metal and insulator layers noted above. In this way, the MEMS cantilever strips or fingers 15A''' and 15B''' can be positioned at strategic locations and actuated separately to provide different mechanical loads at different locations of the FBAR, depending on the location and density of the MEMS cantilever strips or fingers 15A''' and 15B'''.

Figure 8:
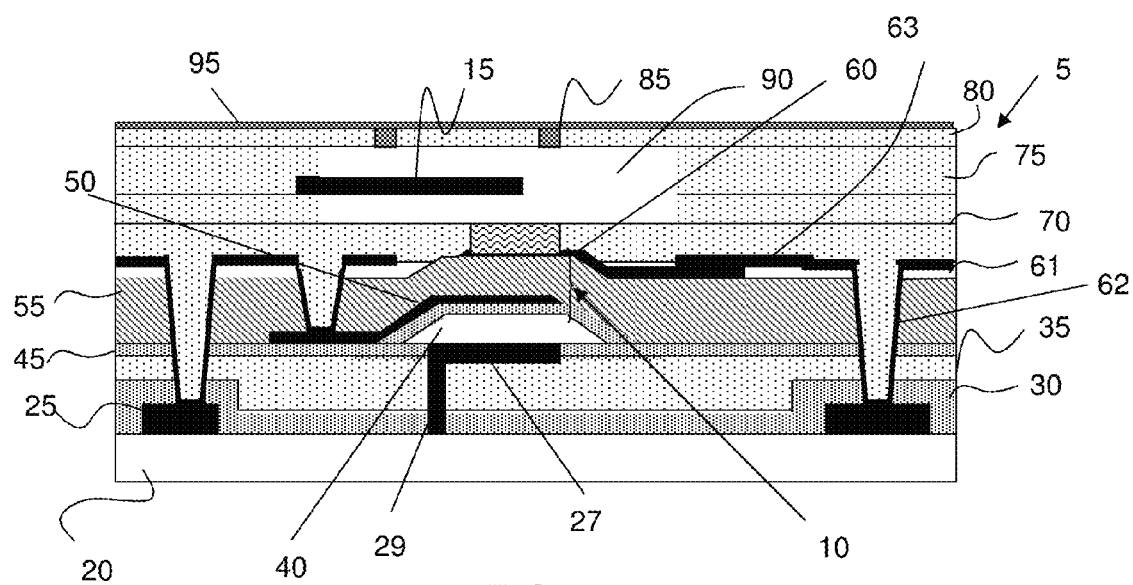
FIG. 8 shows an alternative tunable filter structure and respective fabrication processes in accordance with aspects of the present invention.

FIG. 8 shows a tunable filter structure and respective fabrication processes in accordance with aspects of the present invention. In this embodiment, an additional electrode 27 can be placed under the cavity 40, to pull in the FBAR 10. The pull in of the FBAR is effectively equivalent of a mechanical load being placed on the FBAR 10, thus effectively changing the resonant frequency of the FBAR. The electrode 27 can be, for example, formed within the dielectric layer 45 or the insulator layer 35, using conventional photolithography, etching and deposition processes. In embodiments, the electrode 27 is connected to an interconnect structure 29, formed in the passivation layer 30 and/or substrate 20.

Figure 9:
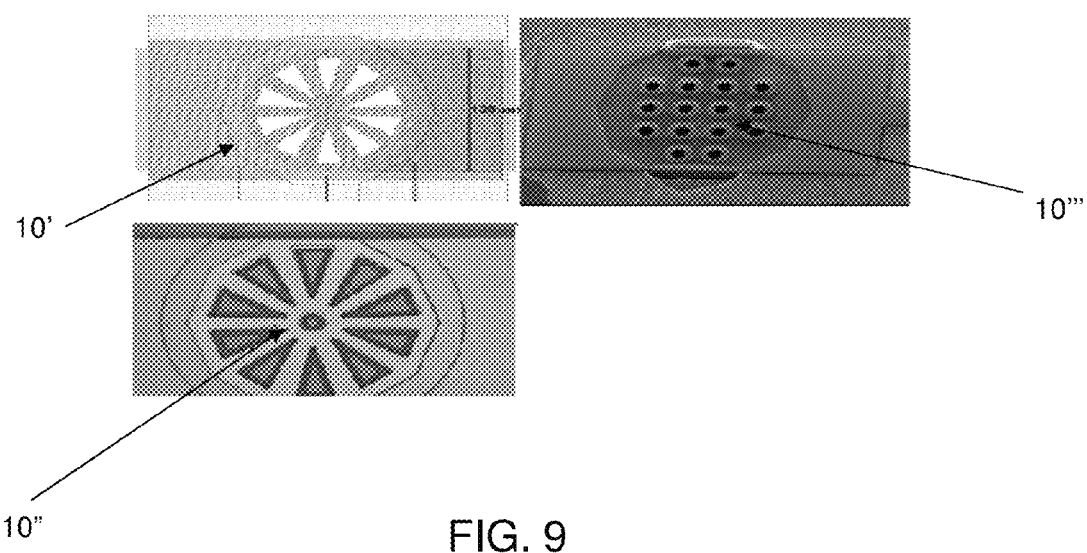
FIG. 9 shows various filter configurations in accordance with aspects of the present invention.

FIG. 9 shows various filter configurations in accordance with aspects of the present invention. For example, the FBAR 10' is a pinwheel design, with 10 arms; whereas FBAR 10" is a pinwheel design with 10 arms and a center hole. It should be understood that in any of the embodiments, the pinwheel design can have more or less than 10 arms, and preferably about two arms. The FBAR 10''' can also comprise a plate with a plurality of holes. As should be understood by those of skill in the art, any of the MEMS implementations and/or electrode configuration of the present invention are contemplated with use of the these different variants shown in FIG. 9.

In embodiments, a method of modifying the frequency comprises determining a first resonant frequency of a filter, and loading the filter to change the first resonant frequency to a second resonant frequency different than the first resonant frequency. The loading can be, for example, activating the MEMS bar or portions thereof, to place a load onto the filter (FBAR). In alternative embodiments, the loading can be to move the filter towards an electrode, by activating the electrode (see, e.g., FIG. FIG. 8).

Figure 10:
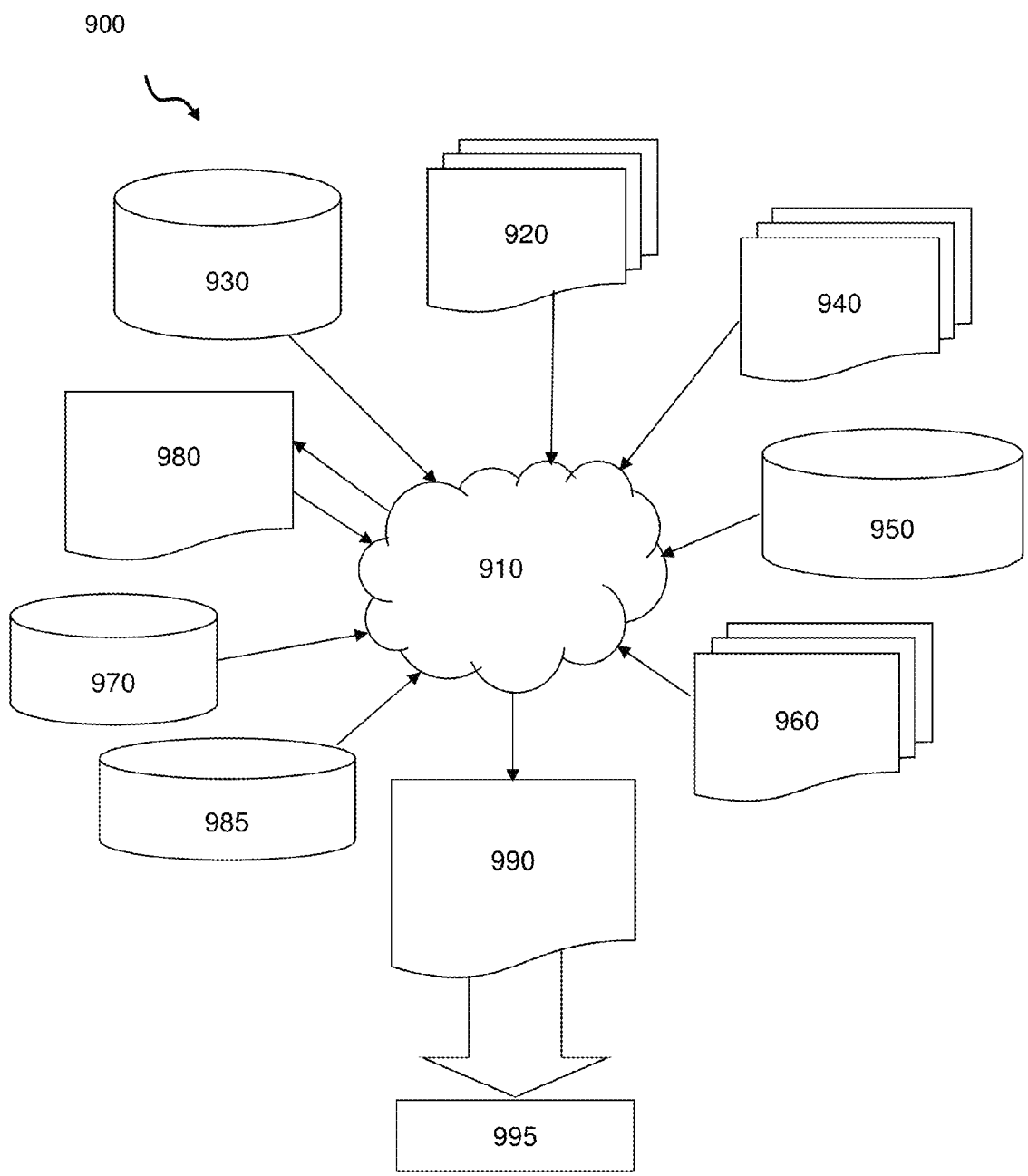
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 3a, 3b, 4a, 4b, 5a, 5b, 6a, 6b and 7-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 3a, 3b, 4a, 4b, 5a, 5b, 6a, 6b and 7-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 3a, 3b, 4a, 4b, 5a, 5b, 6a, 6b and 7-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3a, 3b, 4a, 4b, 5a, 5b, 6a, 6b and 7-9. In one embodiment, design structure 990 may comprise a compiled, executable HDL simulation model that functionally simulates the devices shown in FIGS. 1, 2a, 2b, 3a, 3b, 4a, 4b, 5a, 5b, 6a, 6b and 7-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3a, 3b, 4a, 4b, 5a, 5b, 6a, 6b and 7-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method, comprising:
    determining a first resonant frequency of a filter; and
    loading the filter to change the first resonant frequency to a second resonant frequency different than the first resonant frequency,
    wherein the loading is provided by activating a MEMS bar or portions thereof to place a load onto the filter, and
    wherein the activating the MEMS bar comprises applying a pull-down voltage to the MEMS bar.

2. The method of claim 1, wherein the loading the filter to change the first resonant frequency to the second resonant frequency different than the first resonant frequency is by movement of the filter towards an electrode, by activating the electrode.

3. The method of claim 1, wherein the filter is a Film Bulk Acoustic Resonator.

4. The method of claim 1, wherein the MEMS bar is a single cantilever beam structure.

5. The method of claim 1, wherein the applying the pull-down voltage to the MEMS bar pulls the MEMS bar into contact with the filter.

6. The method of claim 1, wherein the MEMS bar and the filter are separated a space within a range of 0.1 to 5 μm before loading of the filter.

* * * * *